United States Patent [19]

El-Hamamsy et al.

[11] Patent Number: 5,063,332
[45] Date of Patent: Nov. 5, 1991

[54] FEEDBACK CONTROL SYSTEM FOR A HIGH-EFFICIENCY CLASS-D POWER AMPLIFIER CIRCUIT

[75] Inventors: Sayed-Amr A. El-Hamamsy; Joseph C. Borowiec, both of Schenectady, N.Y.

[73] Assignee: General Electric Company, Schenectady, N.Y.

[21] Appl. No.: 631,836

[22] Filed: Dec. 21, 1990

[51] Int. Cl.$^5$ .............................................. H05B 41/24
[52] U.S. Cl. ..................................... 315/248; 315/311; 315/284; 330/207 A
[58] Field of Search ............... 315/248, 310, 311, 224, 315/307, 209 R, 219, DIG. 7; 330/207 A, 251; 331/36 C

[56] References Cited

U.S. PATENT DOCUMENTS

| | | | |
|---|---|---|---|
| 3,662,216 | 5/1972 | Hildebrant | 315/284 |
| 3,899,745 | 8/1975 | Fletcher | 330/251 |
| 4,180,764 | 12/1979 | Morup | 315/284 |
| 4,383,203 | 5/1983 | Stanley | 315/248 |
| 4,571,551 | 2/1986 | Trager | 330/251 |
| 4,628,275 | 12/1986 | Skipper | 330/207 A |
| 4,783,615 | 11/1988 | Dakin | 315/248 |
| 4,812,702 | 3/1989 | Anderson | 313/153 |

FOREIGN PATENT DOCUMENTS 56-89107  7/1981  Japan .................................. 330/251

Primary Examiner—Eugene R. Laroche
Assistant Examiner—Amir Zarabian
Attorney, Agent, or Firm—Jill M. Breedlove; James C. Davis, Jr.; Marvin Snyder

[57] ABSTRACT

A closed-loop control system for a Class-D power amplifier circuit, having a variable output resonant circuit impedance, maintains high-efficiency operation by using the phase angle between the resonant load voltage and current to control tuning of the resonant circuit. The resonant load circuit voltage and current are supplied to a phase detector for detecting the phase angle therebetween and for generating a voltage proportional thereto. The output voltage from the phase detector is compared to a reference voltage by an error amplifier. The resulting error voltage is employed as the input signal to control circuitry for tuning the output resonant circuit. Such a control system is suitable for maintaining high-efficiency operation of an electrodeless high intensity discharge lamp system.

10 Claims, 4 Drawing Sheets

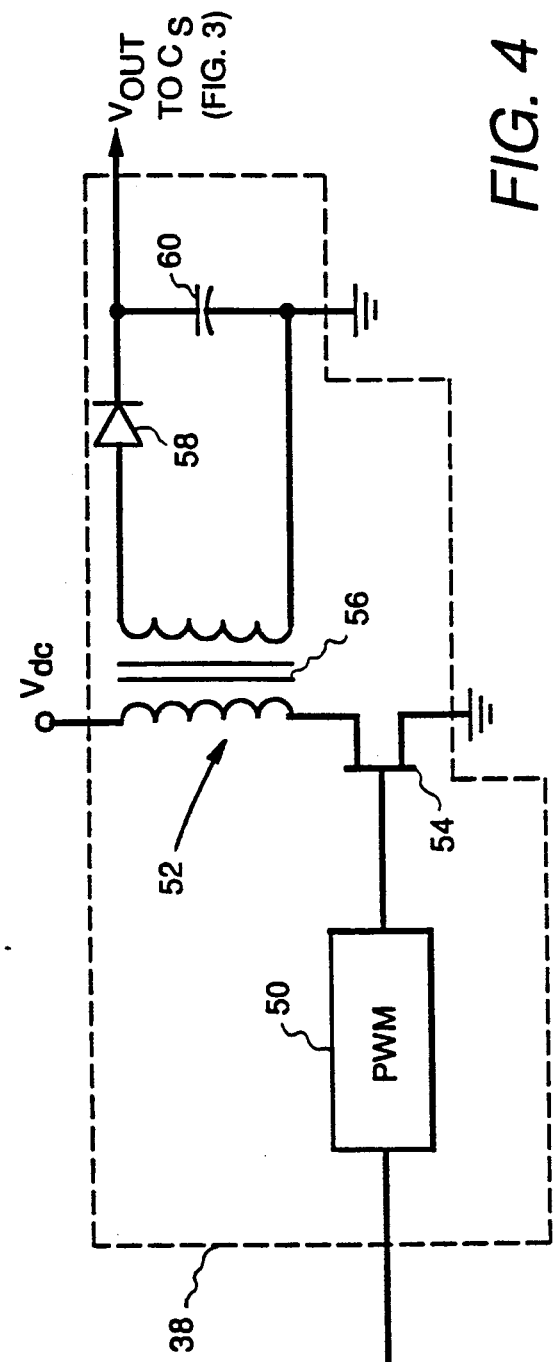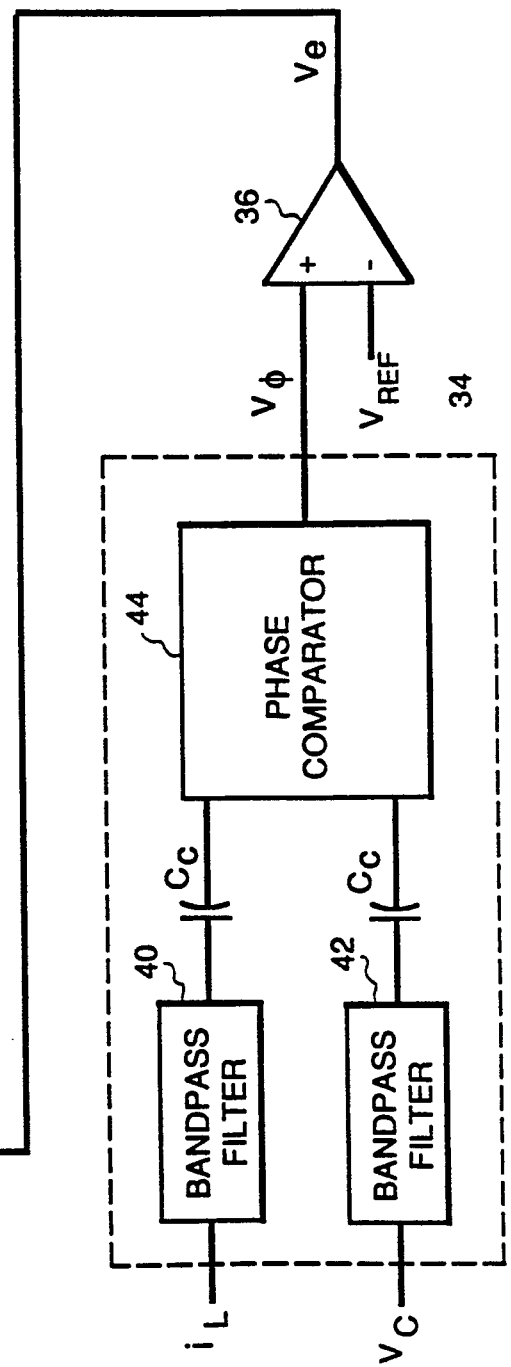
FIG. 4

FEEDBACK CONTROL SYSTEM FOR A HIGH-EFFICIENCY CLASS-D POWER AMPLIFIER CIRCUIT

FIELD OF THE INVENTION

The present invention relates generally to Class-D power amplifier circuits and, more particularly, to a feedback control system therefor.

BACKGROUND OF THE INVENTION

Resonant circuits, such as Class-D power amplifiers, are typically controlled by varying the operating frequency in the feedback system. In some cases, the circuit is made to lock into the resonant mode of the load circuit. In other cases, such as zero-voltage switching quasi-resonant converters, there is a fixed on-time for the active devices, and the devices are turned off when a predetermined condition is detected, i.e. when the device voltage crosses zero. For some Class-D systems, however, the range of frequency variation is limited, thus reducing its effectiveness as a control variable. For example, in a high intensity discharge lamp (HID) system, which typically includes a Class-D ballast, the operating frequency is in the Industrial, Scientific and Medical (ISM) bands of the electromagnetic spectrum wherein moderate amounts of electromagnetic radiation are permissible, since such radiation is generally emitted by an electrodeless HID lamp. Suitable operating frequencies for an HID lamp ballast are in the range from 0.1 to 30 MHz, exemplary operating frequencies being the ISM bands at 6.78, 13.56 and 27.12 MHz. The ISM bands are very narrow, and radiation outside these bands is strictly controlled. Hence, the range of frequency variation in an HID lamp system is limited. As a result, frequency is not a suitable feedback control variable in a Class-D HID lamp system.

In an HID lamp, a medium to high pressure ionizable gas, such as mercury or sodium vapor, emits visible radiation upon excitation typically caused by passage of current through the gas. One class of HID lamps comprises electrodeless lamps which generate an arc discharge by generating a solenoidal electric field in a high-pressure gaseous lamp fill. In particular, the lamp fill, or discharge plasma, is excited by radio frequency (RF) current in an excitation coil surrounding an arc tube. The arc tube and excitation coil assembly acts essentially as a transformer which couples RF energy to the plasma. That is, the excitation coil acts as a primary coil, and the plasma functions as a single-turn secondary. RF current in the excitation coil produces a time-varying magnetic field, in turn creating an electric field in the plasma which closes completely upon itself, i.e., a solenoidal electric field. Current flows as a result of this electric field, resulting in a toroidal arc discharge in the arc tube.

As mentioned hereinabove, a suitable ballast for an electrodeless HID lamp comprises a Class-D power amplifier. Operation of such a ballast at the series resonant frequency of the load circuit maximizes power output. However, operation at a frequency slightly higher than the series resonant frequency of the load circuit maximizes ballast efficiency. Hence, for maximum efficiency, operation is slightly "off" resonance, and a specific ballast load resistance and phase angle are required. To this end, the impedance of the ballast load, including that of the arc discharge as reflected into the ballast load, must be matched to the required ballast load resistance and phase angle. As described in commonly assigned, copending U.S. patent application of J. C. Borowiec and S. A. El-Hamamsy, Ser. No. 472,144, filed Jan. 30, 1990, now allowed, which is incorporated by reference herein, a capacitance connected in parallel with the excitation coil is needed to match the resistive component of the ballast load impedance, and a capacitance connected in series with the excitation coil is needed to obtain the proper phase angle. However, although the series and parallel tuning capacitances provide a matched impedance under lamp-operating, or running, conditions, the output impedance of the ballast load circuit is different under starting conditions. Furthermore, in order to ensure that enough power is provided to start the lamp, the ballast should be tuned under starting conditions. Thereafter, i.e. after the lamp has started, the ballast must be tuned under running conditions for maximum efficiency operation. An automatically variable capacitor for maintaining an electrodeless HID lamp ballast in tune under both starting and running conditions is described in commonly assigned U.S. patent application of S. A. El-Hamamsy and J. C. Borowiec, Ser. No. 534,574, filed Dec. 5, 1989, which application is incorporated by reference herein. As described in the El-Hamamsy et al. patent application, Ser. No. 534,574, a piezoelectric actuator is used to vary the distance between the conductive plates of a variable capacitor by moving a movable plate with respect to a fixed plate in response to a control signal. Unfortunately, a closed-loop control system for such an HID lamp system is not presently available.

Hence, there is presently a need for a closed-loop control system, which does not depend on frequency as a control variable, for high-efficiency Class-D power amplifier circuits, such as the HID lamp ballast employing a variable capacitor described hereinabove.

OBJECTS OF THE INVENTION

Accordingly, an object of the present invention is to provide a closed-loop system for controlling operation of a Class-D power circuit in order to achieve and maintain high-efficiency operation thereof.

Another object of the present invention is to provide a closed-loop control system for a Class-D power circuit which maintains high-efficiency operation even as the value of one or more circuit components varies.

Another object of the present invention is to provide a closed-loop system for controlling operation of an HID lamp ballast in order to achieve and maintain high-efficiency operation of an HID lamp.

Still another object of the present invention is to provide a closed-loop control system for an HID lamp ballast which maintains high-efficiency operation under both lamp-starting and lamp-operating conditions.

Yet another object of the present invention is to provide a closed-loop control system for an HID lamp ballast which maintains high-efficiency operation even as the value of one or more circuit components varies.

SUMMARY OF THE INVENTION

The foregoing and other objects are achieved in a closed-loop control system for achieving high-efficiency operation of a Class-D power circuit having a variable output resonant circuit impedance. The control system of the present invention includes a voltage sensor for sensing the resonant load voltage and a current sensor for sensing the load current of the Class-D circuit. The sensed signals are supplied to a phase detector for detecting the phase angle therebetween and for generating a voltage proportional thereto. The output voltage from the phase detector is compared to a reference voltage by an error amplifier. The resulting error voltage is employed as the input signal to control circuitry for maintaining the Class-D circuit in tune for maximum efficiency operation.

In another aspect of the present invention, a closed-loop control system is provided for achieving and maintaining high-efficiency operation of an electrodeless HID lamp ballast. In a preferred embodiment, the ballast includes an automatically variable tuning capacitor. The control system includes a voltage sensor for sensing the resonant load voltage and a current sensor for sensing the load current of the ballast. The sensed signals are supplied to a phase detector for detecting the phase angle therebetween and for generating a voltage proportional thereto. The output voltage from the phase detector is compared to a reference voltage by an error amplifier. The resulting error voltage is employed as the input signal to control circuitry for tuning the variable capacitor, thereby maximizing efficiency of the HID lamp system.

BRIEF DESCRIPTION OF THE DRAWINGS

The features and advantages of the present invention will become apparent from the following detailed description of the invention when read with the accompanying drawings in which:

FIG. 4 is a schematic illustration of a preferred implementation of the feedback loop of the control system of FIG. 3.

DETAILED DESCRIPTION OF THE INVENTION

Figure 1:
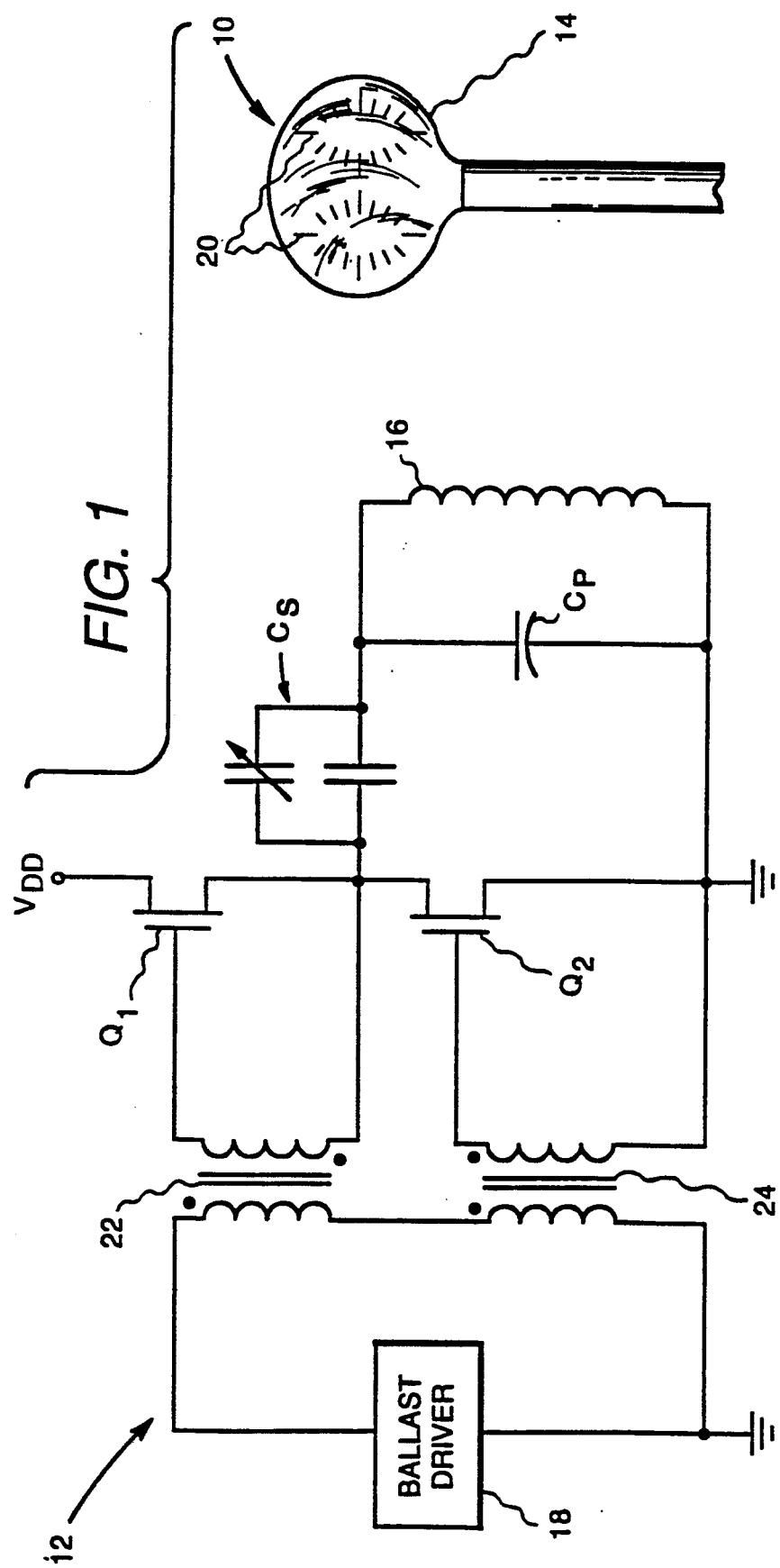
FIG. 1 is a schematic illustration of a Class-D HID lamp ballast.

FIG. 1 illustrates an exemplary Class-D power amplifier circuit which may be suitably controlled using the feedback system of the present invention. In particular, by way of example, the Class-D system of FIG. 1 is shown as comprising an electrodeless HID lamp 10 and associated Class-D ballast 12. It is to be understood, however, that the principles of the present invention apply equally to any Class-D power amplifier circuit; the Class-D HID lamp system is shown and described by way of example only.

As shown in FIG. 1, HID lamp 10 includes an arc tube 14 formed of a high-temperature glass, such as fused quartz, or an optically transparent ceramic, such as polycrystalline alumina. Arc tube 14 contains a fill which may comprise at least one metal halide, such as sodium iodide, and a buffer gas, such as xenon. Electrical power is applied to the HID lamp by an excitation coil 16 disposed about arc tube 14 which is driven by an RF signal via a ballast driver 18 and ballast 12. (For clarity of illustration, coil 16 is not shown in its operational position about arc tube 14.) A suitable excitation coil 16 may comprise, for example, a two-turn coil having a configuration such as that described in commonly assigned, copending U.S. patent application of G. A. Farrall, Ser. No. 493,266, filed Mar. 14, 1990, now allowed, which patent application is incorporated by reference herein. Such a coil configuration results in very high efficiency and causes only minimal blockage of light from the lamp. The overall shape of the excitation coil of the Farrall application is generally that of a surface formed by rotating a bilaterally symmetrical trapezoid about a coil center line situated in the same plane as the trapezoid, but which line does not intersect the trapezoid. However, another suitable coil configuration is described in commonly assigned U.S. Pat. No. 4,812,702 of J. M. Anderson, issued Mar. 14, 1989, which patent is incorporated by reference herein. In particular, the Anderson patent describes a coil having six turns which are arranged to have a substantially V-shaped cross section on each side of a coil center line. Still another suitable excitation coil may be of solenoidal shape, for example.

In operation, RF current in coil 16 results in a time-varying magnetic field which produces within arc tube 14 an electric field that completely closes upon itself. Current flows through the fill within arc tube 14 as a result of this solenoidal electric field, producing a toroidal arc discharge 20 in arc tube 14. The operation of an exemplary HID lamp is described in commonly assigned Dakin U.S. Pat. No. 4,783,615, issued on Nov. 8, 1988, which patent is incorporated by reference herein.

As shown in FIG. 1, ballast 12 comprises a Class-D power amplifier including two switching devices $Q_1$ and $Q_2$ connected in series with a dc power supply $V_{DD}$ in a half-bridge configuration. Switching devices $Q_1$ and $Q_2$ are illustrated as MOSFET's, but other types of switching devices having capacitive gates may be used, such as insulated gate bipolar transistors (IGBT's) or MOS-controlled thyristors (MCT's). Switching devices $Q_1$ and $Q_2$ are coupled to ballast driver 18 via input isolation transformers 22 and 24, respectively. In operation, the switching devices are driven alternately between cutoff and saturation such that one is conducting while the other one is turned off and vice versa. Hence, the Class-D ballast may be conveniently driven by a square wave signal. Alternatively, ballast driver 18 may comprise means for generating two out-of-phase sinusoidal signals, as described in commonly assigned U.S. Pat. No. 5,023,566 of S. A. El-Hamamsy and G. Jernakoff, issued June 11, 1991, which patent is incorporated by reference herein.

As in any Class-D circuit, a resonant load network is connected to the half-bridge at the junction between switching devices $Q_1$ and $Q_2$. Such a resonant load network may comprise a series, parallel or series/parallel resonant circuit, depending on the application. In accordance with the present invention, however, the resonant circuit must have a variable impedance, e.g. by including a variable capacitance, a variable inductance, or a combination thereof. A suitable variable inductance may comprise, for example, a saturable core inductor of a type well-known in the art. On the other hand, for Class-D circuits employing a variable capacitance, a suitable variable capacitor may be of a type described in the Borowiec et al. patent application, Ser. No. 472,144, cited hereinabove. In particular, the variable capacitor of the Borowiec et al. patent application comprises a fixed conductive plate and a substantially parallel, movable conductive plate with a dielectric disposed therebetween. Piezoelectric actuating means is used to vary the distance between the conductive plates by moving the movable plate with respect to the fixed plate. As a result, capacitance changes in inverse proportion to the distance moved. A control signal is provided to activate the piezoelectric actuating means to move the movable conductive plate. The control signal may provide either discrete control for movement of the movable conductive plate between a discrete number of predetermined operating positions, or it may provide continuous control for movement over a range of positions.

In the HID lamp system illustrated in FIG. 1, the resonant load network includes a variable capacitor $C_s$ which is employed both for resonant circuit tuning and blocking dc voltage. The variable capacitor $C_3$ is connected in series with the parallel combination of the excitation coil 16 of HID lamp 10 and a tuning capacitor $C_p$. The parallel combination of capacitor $C_p$ and coil 16 functions as an impedance transformer to reflect the impedance of the arc discharge 20 into the ballast load.

As described in the Borowiec et al. patent application, Ser. No. 472,144, cited hereinabove, capacitors $C_s$ and $C_p$ are chosen to ensure impedance matching for maximum efficiency. That is, these capacitors are chosen to ensure that the ballast load is designed for optimum values of resistance and phase angle. As described hereinabove, the excitation coil of the HID lamp acts as the primary of a loosely-coupled transformer, while the arc discharge acts as both a single-turn secondary and secondary load. The impedance of the arc discharge is reflected to the primary, or excitation coil, side of this loosely-coupled transformer. To match the ballast load impedance for maximum efficiency, the parallel capacitor operates with the excitation coil to match the proper resistive load value, and the series capacitor acts with the combination of the excitation coil and parallel capacitor to yield the required phase angle.

Figure 2:
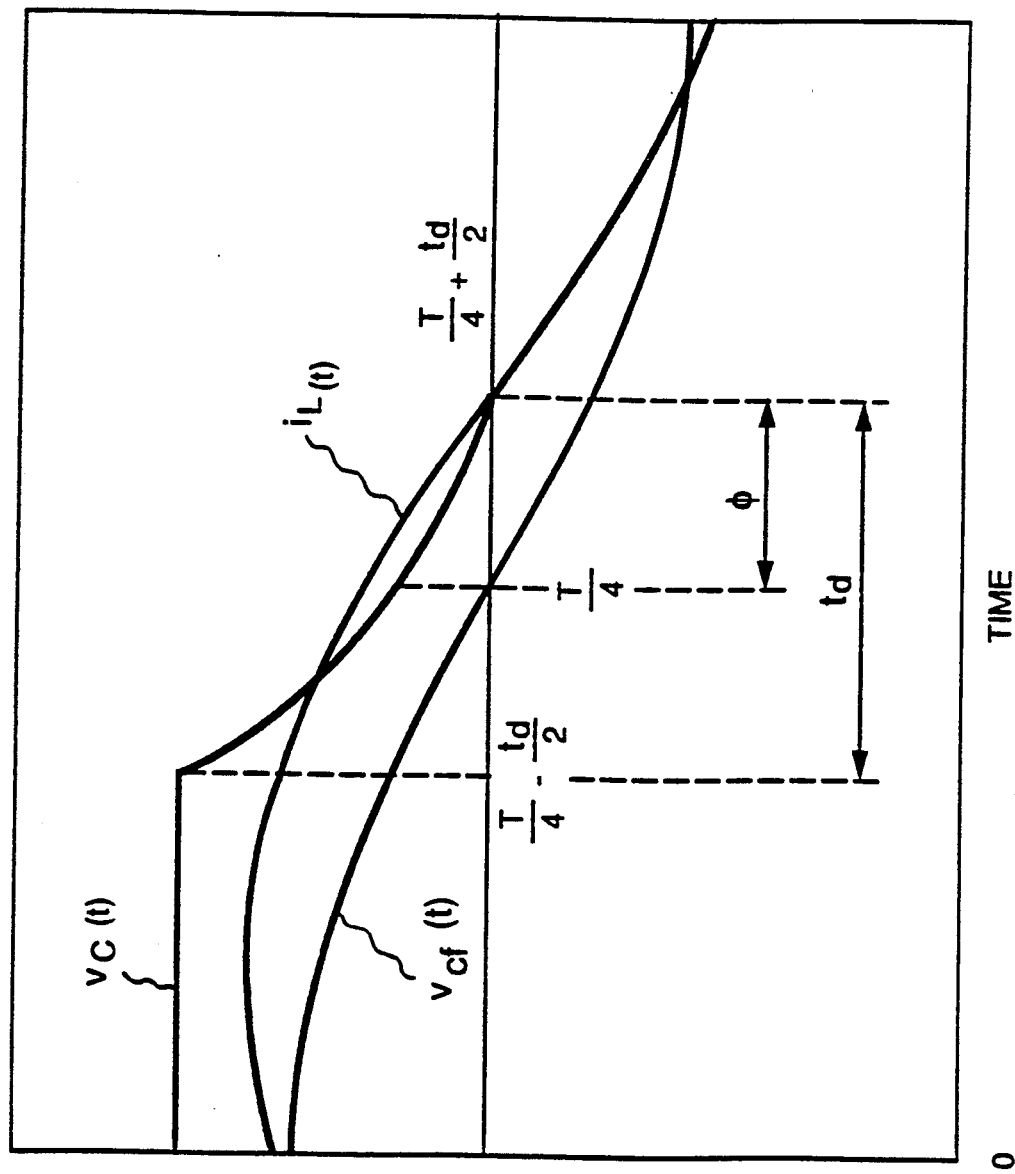
FIG. 2 is a graphical illustration of the output resonant load voltage and current for the ballast of FIG.

The importance of the optimum phase angle $\phi$ in maximizing efficiency may best be understood with reference to the graph of FIG. 2 wherein the resonant load current $i_L(t)$ is plotted against the resonant load voltage $v_c(t)$, i.e. the voltage at the junction between the two switching devices $Q_1$ and $Q_2$. The fundamental component $v_{cf}(t)$ of the resonant load voltage $v_c(t)$ is also shown in FIG. 2. As described in the El-Hamamsy and Jernakoff patent application, Ser. No. 454,614, cited hereinabove, the transition time $t_d$ is the time required for the voltage $v_c(t)$ to transition from its maximum value to its minimum value and vice versa, as shown. The amplitude $V_f$ of the fundamental component waveform $v_f(t)$ may be expressed as:

$$V_f = 2 \frac{V_{DD}}{\pi \phi} \sin \phi, \quad (1)$$

where the load impedance angle $\phi$, in radians, may be expressed in terms of the transition time $t_d$ as follows:

$$\phi = \frac{t_d}{T} \pi, \quad (2)$$

where T represents the period of the gate-source voltage waveform of the respective switching device. As described in the El-Hamamsy and Jernakoff patent application, Ser. No. 454,614, cited hereinabove, zero-voltage switching of the Class-D amplifier of FIG. 1 is attained when the voltage waveform $v_c(t)$ and the current waveform $i_L(t)$ intersect at zero. In this way, the output capacitance of each respective switching device is completely discharged at the switching instant, thereby resulting in lossless switching.

Figure 3:
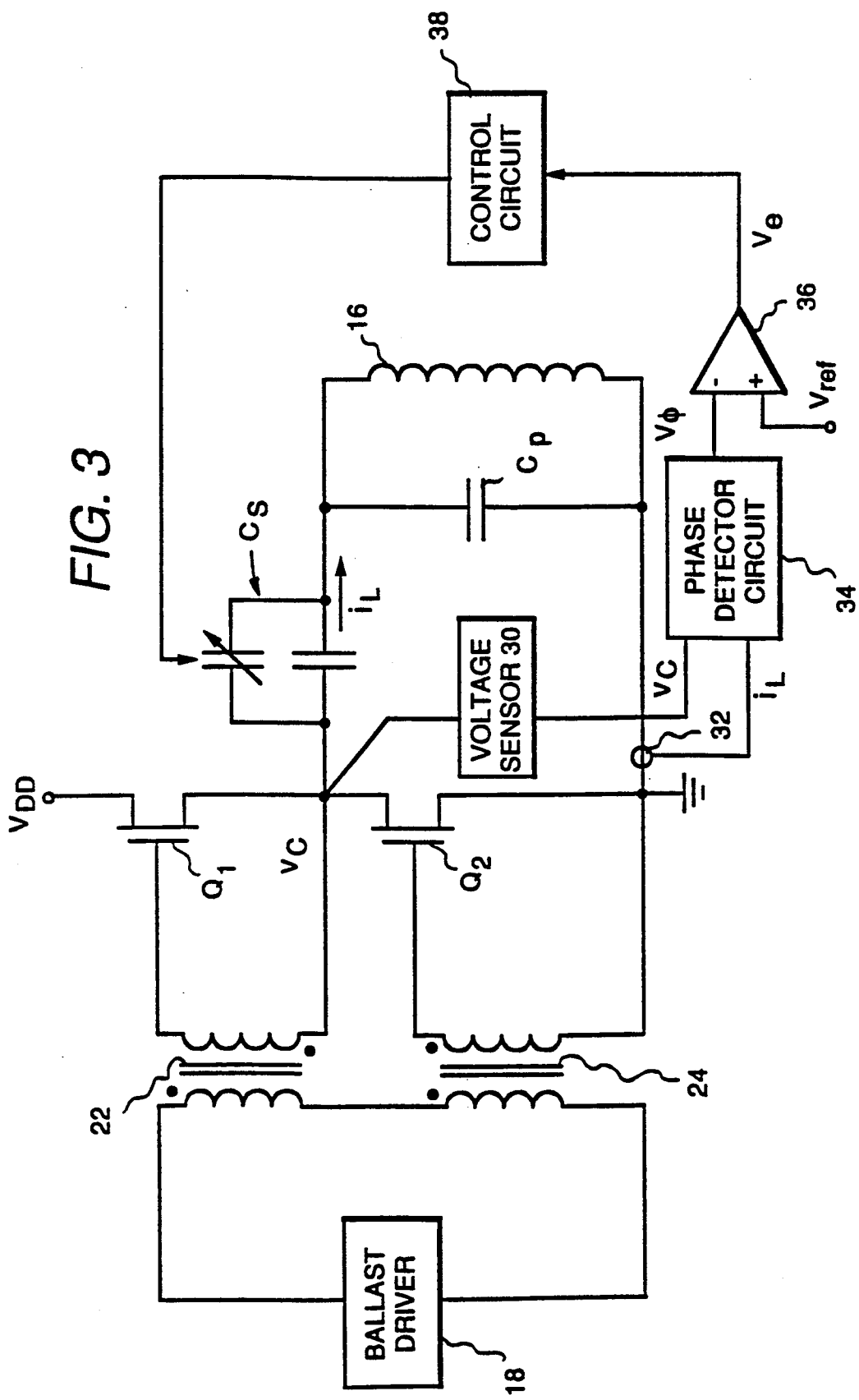
FIG. 3 is a schematic illustration of an electrodeless HID lamp ballast including a closed-loop control system of the present invention.

FIG. 3 illustrates a feedback control loop for controlling the operation of ballast 12 in accordance with the present invention. As described hereinabove, series capacitor $C_s$ preferably comprises a variable capacitor. Such a variable capacitor may be employed to automatically tune the ballast load circuit as the output impedance thereof changes between starting and running conditions, resulting in high-efficiency operation.

As shown in FIG. 3, the voltage $v_c$ is, sensed by a voltage sensor 30, and the current $i_L$ is sensed by a current sensor 32. A suitable voltage sensor may comprise, for example, a voltage dividing network of resistors or capacitors. A suitable current sensor may comprise, for example, a Hall-effect sensor or a current viewing resistor, such as that described in commonly assigned, copending U.S. patent application of S.A. El-Hamamsy, Ser. No. 632,213, filed Dec. 21, 1990, which patent application is incorporated by reference herein. The sensed voltage and current are provided as input signals to a phase detector circuit 34 for determining the phase angle $\phi$ therebetween. The output signal from phase detector 34 comprises a voltage $V\phi$ proportional to the measured phase angle $\phi$. The voltage $V\phi$ is compared in an error amplifier 36 to a reference voltage $V_{ref}$, and the resulting error signal $V_e$ is supplied as the input to a control circuit 38 for continuously tuning the variable capacitor $C_s$ during all operating conditions, thereby maximizing efficiency. FIG. 4 illustrates one preferred implementation of the feedback loop of the present invention including phase detector 34, error amplifier 36 and control circuit 38. The sensed current $i_L$ and voltage $v_c$ are each filtered by bandpass filters 40 and 42, respectively, in order to extract the fundamental components thereof. The filtered signals are then provided via dc blocking capacitors $C_c$ to a phase comparator circuit 44 of a type well-known in the art such as an XR-S200 phase lock loop manufactured by Exar Corporation. The output signal from phase comparator 44 is the voltage $V\phi$ proportional to the phase angle $\phi$ between the fundamental components of the load current and voltage. The voltage $V\phi$ is applied to the noninverting input of error amplifier 36. The reference voltage $V_{ref}$ applied to the inverting input of error amplifier 36 corresponds to the optimum phase angle $\phi$ determined as described hereinabove to achieve maximum efficiency. Error amplifier 36 thus generates the error voltage $V_e = V_\phi - V_{ref}$. The error voltage $V_e$ is provided as the input signal to control circuit 38 which includes a pulse width modulation (PWM) circuit 50 and a dc-to-dc converter 52. By way of example only, converter 52 is illustrated as comprising a flyback converter of a type well-known in the art including a switching device 54 (e.g. a MOSFET) coupled in series with the primary winding of a transformer 56 and a dc bus voltage $V_{dc}$. The secondary winding of transformer 56 is coupled between the anode of a diode 58 and ground. A capacitor 60 is connected between the cathode of diode 58 and ground. PWM circuit 50 provides switching signals having a duty cycle K proportional to the error voltage Ve to the switching device 54. A suitable PWM circuit is a type UC3525A manufactured by Unitrode Integrated Circuits Corporation. The resulting output voltage $V_{out}$ from the converter 52 thus takes the form:

$$V_{out} = V_{dc} \frac{N_s(1-K)}{N_p K},$$

where $N_s$ is the number of transformer secondary turns and $N_p$ is the number of primary turns. The output voltage $V_{out}$ is provided to the variable capacitor $C_s$ (FIG. 3) for maintaining the Class-D ballast in tune under all operating conditions.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A feedback control system for a Class-D power amplifier circuit including two switching devices coupled in series in a half-bridge configuration and having an output resonant circuit having a variable impedance coupled at the junction between said two switching devices, comprising:

phase detecting means for detecting the phase angle between the output resonant circuit voltage and the output resonant circuit current and generating a voltage proportional to said phase angle;

comparator means for receiving the voltage proportional to said phase angle and comparing said voltage to a reference voltage and generating an error signal therefrom; and control means for receiving said error signal and generating a control signal for varying the impedance of said resonant circuit in accordance therewith in order to maintain said resonant circuit in tune and thereby maximize efficiency of said Class-D power amplifier circuit.

2. The feedback control system of claim 1 wherein said resonant circuit comprises a variable capacitance coupled to an inductance.

3. The feedback control system of claim 2 wherein said variable capacitance comprises piezoelectric actuating means for varying the capacitance thereof.

4. The feedback control system of claim 3 wherein said control means comprises a pulse width modulated converter.

5. The feedback control system of claim 1 wherein said resonant circuit comprises a variable inductance coupled to a capacitance.

6. The feedback control system of claim 4 wherein said variable inductance comprises a saturable core inductor.

7. The feedback control system of claim 6 wherein said control means comprises a pulse width modulated converter.

8. A ballast for a high intensity discharge lamp of the type having an excitation coil situated about an arc tube for exciting an arc discharge in an ionizable fill contained in said arc tube, comprising:

a Class-D power amplifier including two switching devices coupled in series in a half-bridge configuration and having an output resonant circuit coupled at the junction between said two switching devices, said output resonant circuit including the inductance of said excitation coil coupled in series with a variable capacitance;

phase detecting means for detecting the phase angle between the output resonant circuit voltage and the output resonant circuit current and generating a voltage proportional to said phase angle;

comparator means for receiving the voltage proportional to said phase angle and comparing said voltage to a reference voltage and generating an error signal therefrom; and control means for receiving said error signal and generating a control signal for varying the value of said variable capacitance in accordance therewith in order to maintain said resonant circuit in tune and thereby maximize efficiency of said ballast.

9. The feedback control system of claim 8 wherein said variable capacitance comprises piezoelectric actuating means for varying the capacitance thereof.

10. The feedback control system of claim 8 wherein said control means comprises a pulse width modulated converter.

* * * * *

UNITED STATES PATENT AND TRADEMARK OFFICE
CERTIFICATE OF CORRECTION

PATENT NO. : 5,063,332

DATED : November 5, 1991

INVENTOR(S) : SAYED-AMR AHMES EL-HAMAMSY and JOSEPH CHRISTOPHER BOROWIEC

It is certified that error appears in the above-identified patent and that said Letters Patent is hereby corrected as shown below:

Column 4, line 60, delete "Borowiec et al." and substitute -- El-Hamamsy et al. -- therefor.

Column 4, line 60, after "Ser. No.", delete "472,144" and substitute -- 534,574 -- therefor.

Column 4, line 62, delete "Borowiec et al." and substitute -- El-Hamamsy et al. -- therefor.

Signed and Sealed this

Sixteenth Day of March, 1993

Attest:

STEPHEN G. KUNIN

*Attesting Officer*     *Acting Commissioner of Patents and Trademarks*